United States Patent [19]

Huie

[11] Patent Number: 5,001,073
[45] Date of Patent: Mar. 19, 1991

[54] METHOD FOR MAKING BIPOLAR/CMOS IC WITH ISOLATED VERTICAL PNP

[75] Inventor: Wing K. Huie, North Wales, Pa.

[73] Assignee: Sprague Electric Company, North Adams, Mass.

[21] Appl. No.: 553,029

[22] Filed: Jul. 16, 1990

[51] Int. Cl.$^5$ .................. H01L 21/331; H01L 21/336
[52] U.S. Cl. ........................................ 437/31; 437/34; 437/56; 437/58; 148/DIG. 9; 357/43
[58] Field of Search ............... 437/31, 33, 34, 44, 437/45, 54, 55, 56, 57, 58, 59; 357/42, 43, 44, 23.3, 23.4; 148/DIG. 9

[56] References Cited

U.S. PATENT DOCUMENTS

| | | | |
|---|---|---|---|
| 4,752,589 | 6/1988 | Schaber | 437/31 |
| 4,830,973 | 5/1989 | Mastroianni | 437/31 |
| 4,868,135 | 9/1989 | Ogura et al. | 437/31 |
| 4,918,026 | 4/1990 | Kosiak et al. | 437/33 |
| 4,954,456 | 9/1990 | Kim et al. | 437/31 |

FOREIGN PATENT DOCUMENTS

| | | | |
|---|---|---|---|
| 0240781 | 10/1987 | European Pat. Off. | 437/44 |
| 0339637 | 11/1989 | European Pat. Off. | 437/34 |

OTHER PUBLICATIONS

Chiu, T. Y. et al., *IEEE Electron Device Letters*, vol. 11, No. 2, Feb. 1990, pp. 85-86.
Brassington, M. P. et al., *IEEE Transactions on Electron Devices*, vol. 36, No. 4, Apr. 1989, pp. 712-719.

Primary Examiner—Brian E. Hearn
Assistant Examiner—T. N. Quach

[57] ABSTRACT

The manufacture of an integrated circuit including an isolated vertical PNP, an isolated vertical NPN and isolated CMOS transistors is described. The PNP transistor has a shallow densely doped emitter made simultaneously with the source and drain of the PMOS transistor. The PNP base is made simultaneously with lightly doped portions of the LDD source and drain of the NMOS transistor. The PNP collector is made simultaneously with the P-well in which the NMOS transistor is formed. A P-buried layer in the isolated vertical PNP transistor provides a low collector resistance and is formed simultaneously with the P-buried layer of the NMOS transistor that extends the P-well there and better isolates the NMOS transistor from the substrate. And the N-buried layer providing superior isolation of the PNP with respect to the substrate is formed simultaneously with the N-buried layer of the vertical NPN transistor. All four of these transistors provide and are well suited for use in analog signal handling circuits. All are capable of operating at up to 15 volts. And both bipolar transistors have a high gain bandwidth.

9 Claims, 1 Drawing Sheet

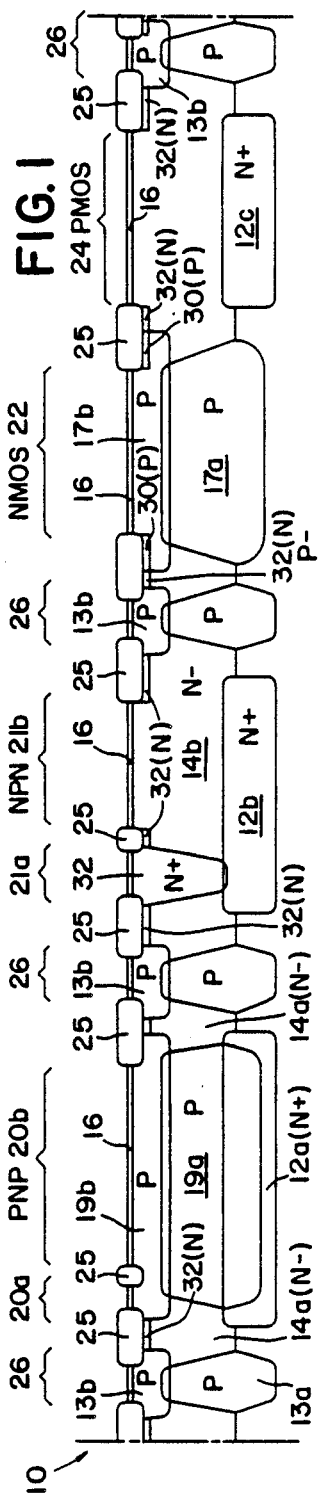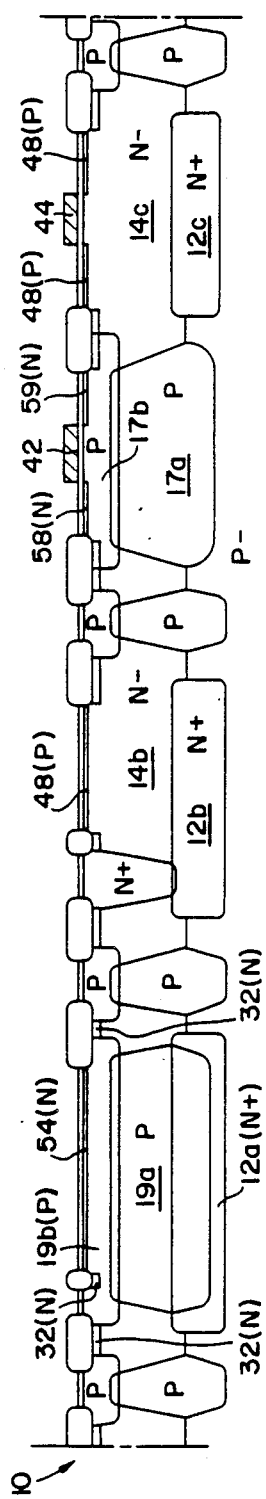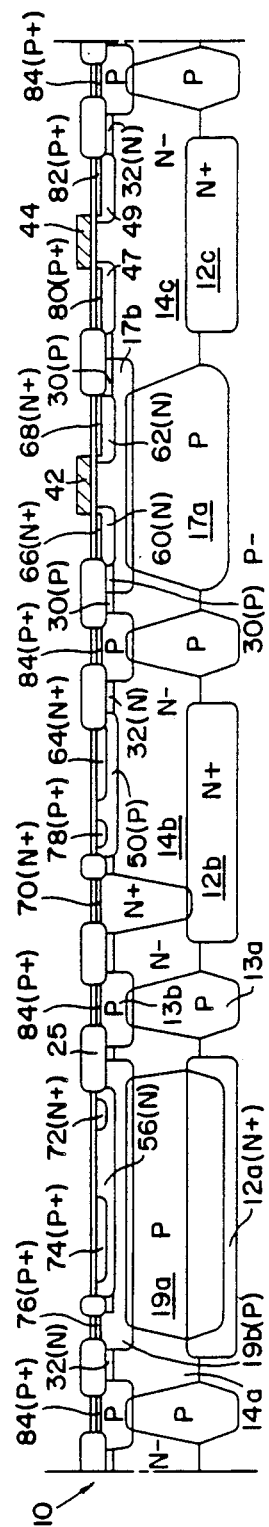

METHOD FOR MAKING BIPOLAR/CMOS IC WITH ISOLATED VERTICAL PNP

BACKGROUND OF THE INVENTION

This invention pertains in general to merged bipolar and CMOS technology, and more particularly to an isolated high performance vertical PNP transistor and method of producing the same.

In the area of linear circuit design (also known as "analog" circuit design), it has been especially difficult to provide high performance PNP transistors.

CMOS technology is generally a large part of any system. The effort to design large analog systems on a single chip requires front end processes which can provide the needed high performance components. In previous systems, different technologies could be optimized on separate chips. However, when the entire system is integrated on one chip, the processes must be designed such that each technology is optimized.

Heretofore, the PNP transistor technology has often been compromised in order to benefit the NPN and CMOS transistors. The three types of PNP devices commonly used in processes for a merged bipolar and CMOS technology are the lateral PNP transistor, the substrate-PNP transistor, and the vertical PNP transistor with employing either N-epitaxial pocket material or a diffused N-well as the PNP base. They all exhibit a low cut-off frequency due to their wide base regions. These transistors exhibit current gain roll-off at low to moderate current levels, due to the use of lightly-doped base regions. The substrate-PNP is not an isolated device because the collector of each PNP transistor is the substrate. Thus, all substrate-PNP devices on a single chip have a common collector. The lateral PNP device requires a large amount of area in order to build the isolated structure and conduction is often a surface conduction which tends to be noisier and leads to a smaller current carrying capability. The PNP base width in constructions where the base region is a diffused N-well or N-epitaxial pocket material, is dependent upon the thickness of the epitaxial layer and the degree of up-diffusion of a P-buried layer serving as the PNP collector. These base-width determining factors mitigate against a narrow base width.

A PNP transistor has recently been disclosed for integration in a bipolar/CMOS process. That process, however, includes forming a P-type epitaxial layer on a P-type substrate. On the other hand, the processes by which substantially all commercial bipolar/CMOS integrated circuits are now made grow an N-epitaxial layer on a P-type substrate. That represents extensive experience and proven merged techniques for making NPN and CMOS transistors which experience is not possible to use with the PNP transistor in an N-epitaxial layer.

It is therefore an object of this invention to provide a method for making a high performance, isolated vertical PNP transistor in an N-epitaxial pocket.

It is a further object of this invention to make such a PNP transistor in a process wherein, at the most, only few if any masking steps are needed in addition to those already used to form a vertical NPN and a pair of CMOS transistors, all being capable of good performance in analog signal circuits.

SUMMARY OF THE INVENTION

A method for making an integrated circuit provides four isolated high performance transistors each of which is isolated and capable of good performance in analog signal processing circuits. An N-type epitaxial layer is grown over a P-type silicon substrate. A network of P-type isolation walls are formed in the epitaxial layer to define a first, second and third epitaxial pockets in which there are to be formed, respectively, an isolated vertical PNP transistor, an isolated vertical NPN transistor, and a pair of CMOS transistors.

An N+ buried layer is formed in the first pocket and there may be formed superimposed a P-buried layer extending upward beyond said N+ buried layer in the first pocket. A mildly doped first P-well formed in the first pocket serves as the PNP collector and extends into contact with the P-buried layer. There is simultaneously formed in a portion of the third pocket a second P-well into which the NMOS transistor of the CMOS pair is to be formed.

The collector region of the vertical PNP transistor is separated from the P-type substrate by the N+ buried layer. The process steps required are also employed to make the N+ buried layer of the PMOS transistor and to make the N-buried layer of the vertical NPN transistor. This feature provides excellent isolation of the PNP transistor without requiring additional processing steps.

It is of special significance that the shallow N-base of the PNP transistor is formed to a controlled depth, i.e. less than 1 micron and preferably of about 0.7 micron by implantation and heating steps that are employed to also form the lightly doped parts of the source and drain of the NMOS transistor. The even shallower and heavily N-doped surface portions of the NMOS source and drain are to a controlled depth e.g. preferably of about 0.4 micron, that is implemented by the same steps used to form the N-type emitter of the vertical NPN transistor. The lightly doped drain (LDD) structures in the NMOS transistor leads to short-channel small-geometry transistors having high breakdown voltage and reduces hot electron effect to further increase the voltage at which the NMOS transistor will operate. The narrow base width of the PNP transistor leads to a high gain bandwidth characteristic. Thus both the PNP and the NPN are suitable for use in operational amplifiers and other analog signal processing circuits and at the same time the $BV_{CEO}$ may be greater than 20 volts.

In the preferred schedule of manufacturing steps, only steps required to make the high performance CMOS and NPN transistors are used to make the high performance vertical isolated PNP transistor of this invention.

BRIEF DESCRIPTION OF THE DRAWING

FIG. 1 shows in side sectional view a portion of a silicon integrated circuit only partially developed by the method of this invention.

FIG. 2 shows the integrated circuit of FIG. 1 further developed and including LOCOS made field oxide and implanted predepositions of P- and N-type dopants.

FIG. 3 shows the integrated circuit of FIG. 2 after completion of the doped regions in the silicon die of which the PNP, NPN and CMOS transistors are comprised.

DESCRIPTION OF THE PREFERRED EMBODIMENTS

Referring to FIG. 1, a die portion 10 of a P-type multi-die single crystal silicon wafer is shown in which there are to be formed an isolated vertical PNP transistor, an isolated vertical NPN transistor and a pair of CMOS transistors. The partially completed die 10 of FIG. 1 is made by the following steps. The wafer including die 10 is heated to grow a sacrificial oxide layer (not shown) on a major surface thereof. Apertures are formed in the oxide layer through which N-type impurity atoms are introduced that are to become N+ buried layers 12a, 12b and 12c. After a heating step to partially drive the N-type impurities into the die substrate 10, selective implantation of P-type impurities is effected by similar steps in the substrate regions at which P-type isolation walls 13a, a P-buried layer 19a for the PNP transistor and the NMOS P-well extension 17a are to be formed. After a heating step to partially drive the P-type impurities, an N-type epitaxial layer 14 about 5.5 um microns thick and of surface resistivity near 2.0 ohm-cm is grown on the substrate surface.

A blanket 700 Å thick oxide film 16 is grown over the epitaxial layer 14. A photoresist mask (not shown) is formed by which ion implantation of P-type impurities ($5 \times 10^{12}$ boron ions cm² @ 80 KEV) is selectively introduced into the epitaxial surface to form a PNP collector region 19b, the P-well 17b for an N-channel CMOS transistor (NMOS transistor) and the top portions 13b of the P-type isolation walls. After removing the photoresist mask, the die 10 (i.e. the whole wafer) is heated to partially drive the implanted P-type impurities to form the PNP collector region 19b, the P-well 17b and walls portions 13b.

A blanket layer of silicon nitride (not shown) of about 1100 Å thickness is then deposited over the oxide film. By standard photoresist-mask and etching steps, removal of portions of the nitride layer is effected, so that the nitride patches remain corresponding respectively to the "device" area 20b and collector contact area 20a of the isolated vertical PNP transistor, to the device area 21b and collector contact area 21a of the isolated vertical NPN transistor, to the device area 22 of the N-channel CMOS transistor and to the device area 24 of the P-channel CMOS transistor. Also in that same selective etching process there are left isolated nitride patches covered by photoresist patches in areas 26 over the P-type walls 13.

To form a P-type channel stop 30 in the field area peripheral of the NMOS device area 22, $6 \times 10^{13}$ boron ions/cm² are implanted at 35 KEV, whereby implantation is selectively stopped by the photoresist/nitride patches covering all the device areas, but not stopped in all field regions surrounding all devices.

The photoresist is then removed. A new photoresist is formed that about exactly covers the areas over the "P-wells" 17b, 19b, 13b and isolation areas 26. The silicon oxide in the field regions outside the resist patches is then etched away. Now, $5 \times 10^{12}$ phosphorus ions are implanted at 50 KEV to form the N-type channel stops 32 in the PNP field region of N-epitaxial material between the P-type collector 19b of said PNP transistor and the isolation wall portion 13b, and between the P-type base 50 of said NPN transistor and the isolation wall portion 13b, and to form the N-type channel stops 32 in the PMOS field region of N-epitaxial material between said P-type isolation wall (13b and said source 80 and drain 82). The photoresist mask is then removed.

Field regions 32 have been exposed to both boron and phosphorus field implants having the effect of a net N-type doping there. The field stops 30 increase the breakdown voltage of the NMOS transistor. The field stops 32 increase the breakdown voltage of the vertical PNP, the vertical NPN and the PMOS transistors both by increasing punch through voltage there and by increasing the threshold of the surface N-epitaxial material in each transistor. The breakdown voltages of all transistors exceeds twenty volts.

The die is heated in steam to grow a pattern of a heavy field oxide 25, of at least 5000 Å and preferably about 12000 Å thickness. During this heating step, the selectively etched refractive nitride 18 is employed as a device-areas-mask to limit the growth of the thick field oxide 25 to the regions surrounding and outside of transistor device (and collector contact) areas 20a, 20b, 21a, 21b, 22 and 24. This is the well-known LOCOS process.

The nitride layer is then removed and a new photoresist mask (not shown) is formed with an aperture through which phosphorus is implanted to form the N+ plug 32 that is to serve as a part of the NPN collector. The photoresist is removed and the wafer heated to drive the plug 32 into contact with the N+ buried layer 12b.

The partially completed integrated circuit die portion 10 at this point in the process is as shown in FIG. 1.

Next a light blanket channel adjust implant may be effected through the pad oxide 16 and into all device areas.

The epitaxial surface is cleared of all remaining oxide in all device areas and all collector and isolation wall contact areas.

Referring to FIG. 2, a high quality gate oxide 38 is grown over the exposed silicon to a thickness of about 700 Å. This oxide 38 is to serve as the gate oxide in the NMOS and PMOS transistors. The initial growth of the gate oxide 38 is accomplished in as short a time as possible preferably heating to less than 900° C., without threatening gate-oxide quality. The advantage of speed and avoidance of high temperatures during the initial period for growing the gate oxide 38 is (a) that early oxide coverage of the quick diffusing phosphorus in the plug 32 and (b) that early oxide coverage of plug area 24 and MOS transistor device areas 22 and 24 assure that there will be no substantial autodoping of phosphorus from the plug 32 into the channels of the MOS devices which could make the control of MOS device thresholds difficult to achieve.

A blanket coating of heavily phosphorus doped polysilicon is deposited and selectively etched away to leave the polysilicon NMOS gate 42 and the PMOS gate 44 shown in FIG. 2.

A photomask is formed having an aperture over a major part of the NPN device area 21b and optionally an aperture over the PMOS transistor area 24. A boron predeposition 48 is then implanted there at a dose of $8 \times 10^{13}$ ions cm$^{-2}$ 40 KEV. This P-type deposition is to become the P-base 50 of the NPN transistor and optionally also becomes the LDD portions 47 and 49 of sources and drains in the PMOS transistor. These lightly doped portions 47 and 49 of the sources and drains of the PMOS transistor increase the transistor breakdown voltage and improve linearity of transconductance, $g_m$, leading to excellent PMOS performance in analog signal handling circuits. This predepositon photomask is now removed.

A photomask is formed with an aperture over a central area of the isolated vertical PNP transistor region 20b and an aperture over and extending beyond the NMOS transistor gate 42 in two opposite directions. Referring to FIGS. 2 and 3, phosphorus is then implanted at a dose of $1 \times 10^{14}$ and at 80 KEV, serving as an N-type predeposition 54 that is to become the N-base 56 of the isolated vertical PNP transistor. Predepositions 58 and 59 are simultaneously formed and are to become lightly doped regions 60 and 62, i.e. portions of a lightly doped drain (LDD) and a lightly doped source for the NMOS transistor. The photomask is removed. The lightly doped source and drain substantially increases the breakdown voltage of the NMOS transistor and furthermore makes the transconductance, $g_m$, of this transistor more linear and more suitable for analog signal amplification.

The wafer is then heated for 60 minutes at 1025° C. to drive both the P-predeposition 48 and N-predepositions 54, 58 and 59 (as seen in FIG. 2). The N-base region 56 is driven to a depth of 0.60 um. Likewise predepositions 58 and 59 are driven to the same depth to become the lightly N-doped or LDD portions 60 and 62 respectively of the drain and source of the NMOS transistor. The base regions 56 and 50 of the PNP and NPN transistors, respectively, are now fully formed as shown in FIG. 3.

A photomask is now formed through which $5 \times 10^{15}$ arsenic ions $cm^{-2}$ are implanted that are to become the emitter 64 of the NPN transistor, the heavily doped portions 66 and 68 of the NMOS transistor drain and source, respectively, the N+ contact portion 70 of the N+ plug 32 in the NPN transistor, and the N+ contact 72 in the N-base 56 of the isolated vertical PNP transistor. After removing the photomask, the wafer is heated to 1025° C. for 30 minutes to anneal the epitaxial silicon in the areas of the N+ implant.

A photomask is made through which $10^{15}$ boron atoms $cm^{-2}$ are implanted at 40 KEV to form the P-type emitter 74 of the vertical PNP transistor, the collector contact region 76, the base contact region 78 in the NPN transistor, the source 80 and drain 82 of the PMOS transistor, and isolation wall contacts 84.

The emitter 74 has a depth of 0.45 micron and the base region 56 in which it is formed has a depth of 0.70 micron. Thus the base width in this triple diffused isolated vertical PNP is very small; namely, 0.25 micron leading to a high frequency cutoff characteristic exceeding 100 MHz. This high gain-bandwidth transistor is well suited for use in operational amplifier circuits and other analog-signal handling circuits.

What is claimed is:

1. A method for making an integrated circuit comprising growing an N-type epitaxial layer over a major surface of a P-type silicon substrate;
    forming a network of P-type isolation walls in said epitaxial layer to define first, second and third epitaxial pockets of N-epitaxial material wherein an isolated vertical PNP transistor, an isolated vertical NPN transistor and a pair of CMOS transistors are to be formed, respectively:
    forming one N+ buried layer in said first pocket;
    selectively implanting a P-type dopant into said first and a part of said third epitaxial pockets and heating said substrate to drive said P-type dopant to form one P-well to serve as the collector of said vertical PNP transistor in said first pocket and to form in said third pocket another P-well in which the NMOS transistor of said CMOS transistors is to be formed;
    forming one discrete conductive film in said third pocket over a part of said another P-well to serve as the gate of said NMOS transistor, and another discrete conductive film over a part of said third pocket that is of N-epitaxial material, and to one side of said another P-well, to serve as the gate of the PMOS transistor of said CMOS transistors:
    selectively implanting N-type ions in one implanting step into a portion of said one P-well in said first epitaxial pocket and into two small portions of said another P-well in said third epitaxial pocket, which small portions lie on opposite sides of and adjacent to said NMOS transistor gate, and
    heating to drive said N-type ions deeper into said first epitaxial pocket and partially into said one P-well, respectively, to simultaneously form the N-base of said PNP transistor and to form lightly doped parts of the source and the drain of said NMOS transistor on opposite sides of and adjacent to said NMOS transistor gate.

2. The method of claim 1 additionally comprising selectively implanting N-type ions to form a double diffused surface portion of said NMOS source and drain that is more heavily N-doped and shallower than said lightly doped N-doped parts.

3. The method of claim 1 additionally comprising selectively implanting P-type ions into a surface portion of said N-base region of said PNP transistor, and annealing at a mildly elevated temperature to form a shallow heavily doped P-type emitter of said PNP transistor and to provide a narrow base width of said PNP transistor of from 0.2 to 0.4 micron.

4. The method of claim 1 additionally comprising forming a P-doped buried layer in said first epitaxial pocket extending out of said N+ buried layer further into said first epitaxial pocket and into overlapping relationship with said one P-well.

5. The method of claim 4 wherein said forming said one P-doped buried layer additionally includes simultaneously forming another P-doped buried layer in said third epitaxial pocket under said NMOS transistor.

6. The method of claim 1 additionally comprising implanting P-type ions selectively into the field regions peripheral of said PNP, NPN, NMOS and PMOS transistors to form a P-type channel stop region peripheral of said NMOS transistor.

7. The method of claim 6 additionally comprising masking off PNP transistor and surrounding field region and said NMOS transistor and surrounding field region, and implanting N-type ions into the field regions peripheral of said NPN and PMOS transistors to form net-N-type channel stops peripheral of said NPN and PMOS transistors, respectively, and to form peripheral of said PNP transistor a net-N-type region peripheral of said one P-well for increasing the breakdown voltage of said PNP transistor.

8. The method of claim 1 additionally comprising forming a P-type base in said second epitaxial pocket; and implanting in one step a heavy dose of N-type ions selectively in said first, second and third epitaxial pockets for form the base contact region in said PNP transistor, to form a heavily doped source portion and drain portion of NMOS transistor and provide double diffused sources and drains in said NMOS transistor.

9. The method of claim 1 additionally comprising forming a second N+ buried layer in said second pocket simultaneously with said forming said one N+ buried layer.

* * * * *